United States Patent
Shen et al.

(10) Patent No.: US 8,638,636 B2
(45) Date of Patent: Jan. 28, 2014

(54) WORD LINE DECODER CIRCUIT APPARATUS AND METHOD

(75) Inventors: Shin-Jang Shen, Jhubei (TW); Bo-Chang Wu, Zhubei (TW); Chuan Ying Yu, Zhubei (TW); Ken-Hui Chen, Hsinchu (TW); Kuen-Long Chang, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 92 days.

(21) Appl. No.: 12/816,960

(22) Filed: Jun. 16, 2010

(65) Prior Publication Data

US 2011/0069571 A1    Mar. 24, 2011

Related U.S. Application Data

(60) Provisional application No. 61/244,271, filed on Sep. 21, 2009, provisional application No. 61/245,030, filed on Sep. 23, 2009.

(51) Int. Cl.
*G11C 8/00*  (2006.01)
(52) U.S. Cl.
USPC ............. 365/230.06; 365/189.09; 365/185.23
(58) Field of Classification Search
USPC .................. 365/218, 189.15, 189.16, 189.05, 365/189.11, 189.09, 230.06, 230.08, 185.23
See application file for complete search history.

(56) References Cited

U.S. PATENT DOCUMENTS

| | | | | |
|---|---|---|---|---|
| 5,513,146 | A | | 4/1996 | Atsumi et al. |
| 5,521,867 | A | * | 5/1996 | Chen et al. ............... 365/185.33 |
| 5,619,450 | A | * | 4/1997 | Takeguchi ................ 365/185.23 |
| 5,677,875 | A | * | 10/1997 | Yamagata et al. ....... 365/185.26 |
| 5,680,349 | A | * | 10/1997 | Atsumi et al. ............ 365/185.23 |
| 5,812,459 | A | * | 9/1998 | Atsumi et al. ............ 365/185.23 |
| 5,966,331 | A | * | 10/1999 | Shiau et al. .............. 365/185.23 |
| 5,999,456 | A | * | 12/1999 | Sali et al. ................. 365/185.28 |
| 6,104,665 | A | * | 8/2000 | Hung et al. ............... 365/230.06 |
| 6,469,952 | B1 | * | 10/2002 | Tsukikawa ............... 365/230.06 |
| 6,535,430 | B2 | * | 3/2003 | Ogura et al. ............. 365/185.23 |
| 6,621,743 | B2 | * | 9/2003 | Ogane ...................... 365/185.23 |
| 6,992,926 | B2 | * | 1/2006 | Iwase et al. .............. 365/185.23 |
| 7,965,561 | B2 | * | 6/2011 | Garofalo et al. ......... 365/185.23 |

\* cited by examiner

*Primary Examiner* — Kretelia Graham
(74) *Attorney, Agent, or Firm* — Kenta Suzue; Haynes Beffel & Wolfeld LLP

(57) ABSTRACT

One embodiment of the technology is an apparatus, a memory integrated circuit. The memory integrated circuit has word line address decoding circuitry. The circuit allows selection of a single word line to have an erase voltage. A decoder circuit includes an inverter and logic. The inverter has an input, and an output controlling a word line to perform the erase operation. A voltage range of the input extends between a first voltage reference and a second voltage reference. Examples of voltages references are a voltage supply and a ground. In some embodiments, this wide voltage range results from the input being free of a threshold voltage drop from preceding circuitry limiting the voltage range of the input. The logic of the decoder is circuit is controlled by a word line address to determine a value of the input of the inverter during the erase operation.

18 Claims, 7 Drawing Sheets

Read/PGM waveform

Erase waveform

WORD LINE DECODER CIRCUIT APPARATUS AND METHOD

REFERENCE TO RELATED APPLICATION

This application claims the benefit of U.S. Provisional Application 61/244,271 filed 21 Sep. 2009 and claims the benefit of U.S. Provisional Application 61/245,030 filed 23 Sep. 2009, which are incorporated herein by reference.

BACKGROUND

1. Field of the Invention

This technology relates to a memory x-decoder.

2. Description of Related Art

In nonvolatile memory such as flash memory, the erase operation is applied to memory cells by applying a negative voltage between the word line of the memory cell and the semiconductor body of the memory cell. For example, a negative voltage is applied to the in gate and a positive voltage or ground is applied to the semiconductor body.

Unfortunately, applying a negative voltage to a single word line is nontrivial. Accordingly, it is common for an entire sector of memory cells to be erased in a single erase operation, by applying a negative voltage to all word lines in the sector of memory cells.

It is also common for pre-decoder circuitry to be connected to word lines via a pass transistor and cross-coupled inverters/latch. However, this approach is problematic for low voltage applications, because this intermediate pass transistor results in a transistor threshold voltage drop between the pre-decoder circuitry output and the latch. Given the already limited voltage range of low voltage applications, losing part of the limited voltage range to a transistor threshold voltage drop has a negative impact on performance of the memory, in particular the latch which is connected to the word line.

SUMMARY

One embodiment of the technology is an apparatus, a memory integrated circuit. Many such embodiments allow selection of a single word line to have an erase voltage, rather than the entire sector of word lines. Traditional erase operations are performed with a specificity of not individual memory locations, but rather entire sectors of physically contiguous memory locations.

The memory integrated circuit has a plurality of decoder circuits controlling a plurality of word lines. The plurality of decoder circuits decode word line addresses to identify a subset of the plurality of word lines to perform an erase operation. The subset can be a single word line, or several word lines from the sector of word lines.

The decoder circuits include an input, and output, and a plurality of parallel electrical paths. The input of a decoder circuit receives a word line address. The output of a decoder circuit controls a single word line, typically via a word line driver such as an inverter. The plurality of parallel electrical paths including a first parallel path and a second parallel path, where both the first parallel path and the second parallel path controlled by the word line address to determine a value of the output.

Another embodiment of the technology is an apparatus, a memory integrated circuit. Many such embodiments allow selection of a single word line to have an erase voltage, rather than the entire sector of word lines. This following embodiment eliminates a cause of voltage loss, increasing suitability for low voltage supply applications.

The memory integrated circuit is powered by a plurality of reference voltages including a high reference voltage and a low reference voltage. The memory integrated circuit includes a plurality of decoder circuits controlling a plurality of word lines. The plurality of decoder circuits decode word line addresses to identify a subset of the plurality of word lines to perform an erase operation.

The decoder circuits include an input, an output, and an internal node. The input receives a word line address. The output controls a single word line. The internal node is controlled by the word line address to determine a value of the output. The internal node has a range between the high reference voltage and the low reference voltage.

Another embodiment is an apparatus, a memory integrated circuit. The memory integrated circuit has a plurality of decoder circuits controlling a plurality of word lines. The plurality of decoder circuits process word line addresses to identify a subset of the plurality of word lines to perform an erase operation on the subset of the plurality of word lines. Such identification of word lines to be erased, is performed with a specificity of individual word lines. This is a significant improvement over traditional technology that must erase multiple contiguous word lines of memory in a single erase operation.

A decoder circuit of the plurality of decoder circuits includes an inverter and logic. The inverter has an input, and an output controlling a word line to perform the erase operation. A voltage range of the input extends between a first voltage reference and a second voltage reference. Examples of voltages references are a voltage supply and a ground. In some embodiments, this wide voltage range results from the input being free of a threshold voltage drop from preceding circuitry limiting the voltage range of the input.

The logic of the decoder is circuit is controlled by a word line address to determine a value of the input of the inverter during the erase operation. A common example of logic is combinational logic with Boolean logic gates.

In various embodiments, the logic includes, for an inverter of the inverters, a plurality of electrical paths between an inverter determinative node and the first voltage reference. The plurality of electrical paths are controlled by the word line address during the erase operation. The inverter determinative node determines the value of the input of the inverter during the erase operation. In some embodiments, the inverter determinative node is the input of the inverter, or some other node that determines the input of the inverter. In some embodiments, the plurality of electrical paths are one or more transistors with current paths between the inverter determinative node and the first voltage reference. Transistors in different paths (in parallel) that are turned on by different signals perform a NOR operation between the different signals. Transistors in the same path (in series) that are turned on by different signals perform a NAND operation between the different signals.

In one embodiment, the plurality of electrical paths are turned off during the erase operation for the decoder circuits controlling word lines selected for the erase operation. This has the effect of not bringing the input of the inverter to the first voltage reference, such that when the first voltage reference is low or ground, the inverter output is low or ground.

In one embodiment, at least one of the plurality of electrical paths is turned on during the erase operation for the decoder circuits controlling word lines unselected for the erase operation. This has the effect of bringing the input of the inverter to the first voltage reference, such that when the first voltage reference is low or ground, the inverter output is high.

In one embodiment the plurality of electrical paths includes at least a first electrical path and a second electrical path. The first electrical path is turned on during the erase operation for the decoder circuits controlling word lines unselected for the erase operation. The second electrical path is turned on during a program operation for the decoder circuits controlling word lines selected for the program operation and during a read operation for the decoder circuits controlling word lines selected for the read operation.

Various embodiments include, for an inverter of the inverters, in addition to the plurality of electrical paths, an additional electrical path between the inverter determinative node and the second voltage reference. In one embodiment, the additional electrical path is turned on during the erase operation regardless of the word line address with a current capacity weaker than the plurality of electrical paths. In another embodiment, the electrical path is turned on during the erase operation, program operation, and read operation regardless of the word line address with a current capacity weaker than the plurality of electrical paths. Such an "always on" electrical path is an "always on" transistor that is weakly turned on, or with an otherwise weak current capacity that tends to bias the inverter determinative node at the second voltage reference. However, because this additional electrical path is weak, various paths of the plurality of electrical paths can overpower the additional electrical path and bias the inverter determinative node at the first voltage reference instead.

Some embodiments include a plurality of pre-decoder circuits controlled by the word line addresses and controlling the logic of the plurality of decoder circuits. In one embodiment, the plurality of pre-decoder circuits includes additional logic controlled by subsets of the word line address varying across the plurality of pre-decoder circuits.

Another embodiment is an apparatus, a memory integrated circuit powered by a plurality of reference voltages including a first voltage reference and a second voltage reference. The memory integrated circuit has a plurality of decoder circuits controlling a plurality of word lines and an array of memory cells controlled by the plurality of word lines, such that the word line address identifies an individual word line of the plurality of word lines that applies voltages.

Another embodiment is a method. The method has the step of processing, on a memory integrated circuit with a plurality of word lines, word line addresses. The step of processing includes identifying, with a specificity of individual word lines, a subset of the plurality of word lines to perform an erase operation on the subset of the plurality of word lines. The step of processing also includes determining values of inputs of inverters having outputs controlling word lines from the plurality of word lines to perform the erase operation. The inputs of the inverters have a voltage range that extends between a first voltage reference and a second voltage reference. The method has the step of, responsive to the processing, the outputs of the inverters controlling the word lines to perform the erase operation.

In various embodiments, the processing includes the step of, responsive to a word line address of the word line addresses, controlling, for an inverter of the inverters, a plurality of electrical paths between an inverter determinative node of the inverter and the first voltage reference. The inverter determinative node determines the value of the input of the inverter, such as during the erase operation.

One embodiment includes the step of turning off the plurality of electrical paths during the erase operation for the inverter controlling a word line selected for the erase operation.

One embodiment includes the step of turning on at least one of the plurality of electrical paths during the erase operation for the inverter controlling a word line unselected for the erase operation.

One embodiment includes the step of turning on a first electrical path of the plurality of electrical paths during the erase operation for the inverter controlling a word line unselected for the erase operation, and the step of turning on a second electrical path of the plurality of electrical paths during a program operation for the inverter controlling the word line selected for the program operation and during a read operation for the inverter controlling the word line selected for the read operation.

One embodiment includes the step of turning on an electrical path, with a current capacity weaker than the plurality of electrical paths, between the inverter determinative node and the second voltage reference during the erase operation regardless of the word line address.

One embodiment includes the step of turning on an electrical path, with a current capacity weaker than the plurality of electrical paths, between the inverter determinative node and the second voltage reference during the erase operation, a program operation, and a read operation, regardless of the word line address.

One embodiment includes the step of processing the word line addresses in a plurality of pre-decoder circuits.

In one embodiment the voltage range of the inputs extends between the first voltage reference and the second voltage reference, in that the inputs are free of a threshold voltage drop from preceding circuitry limiting the voltage range of the inputs.

The technology described herein also covers methods and other apparatuses as disclosed to those of ordinary skill in the art.

DETAILED DESCRIPTION

Figure 1:
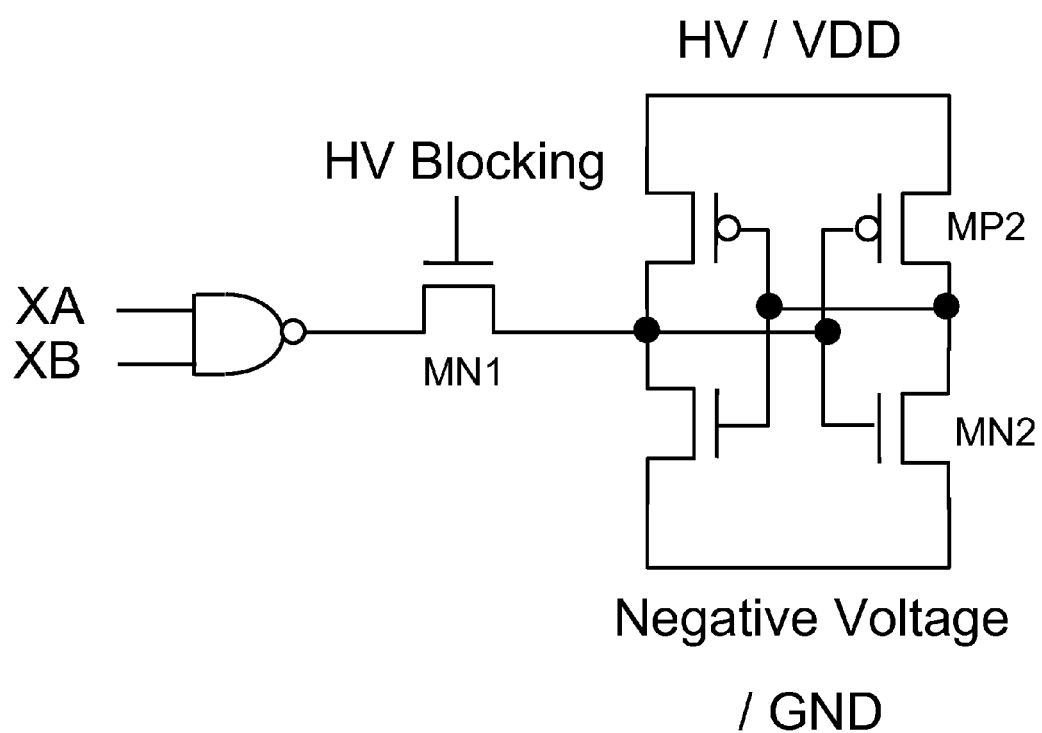
FIG. 1 is an example of an X-decoder circuit that decodes a memory address to a word line of a memory array.

FIG. 1 is an example of an X-decoder circuit that decodes a memory address to a word line of a memory array.

This X-decoder circuit suffers from the problem of the transistor threshold voltage drop between the pre-decoder circuitry output and the latch connected to word lines via a pass transistor and cross-coupled inverters/latch. This approach is also problematic because the pre-decoding circuitry for erasing a single word line is complicated. The latch itself has no decoding circuitry, which results in moving the entire burden of decoding into the pre-decoding circuitry.

In FIG. 1, a NAND gate has inputs receiving XA and XB and an output connected to a first current carrying terminal of n-type transistor MN1. N-type transistor MN1 has a gate receiving HV Blocking, and a second current carrying terminal. The second current carrying terminal of n-type transistor MN1 is coupled to a cross-coupled pair of inverters. The cross-coupled pair of inverters has a first inverter with p-type transistor MP2 and n-type transistor MN2 coupled between voltages "HV/VDD" and "Negative Voltage/GND". The cross-coupled pair of inverters also has a second inverter with another p-type transistor and another n-type transistor coupled between voltages "HV/VDD" and "Negative Voltage/GND". The first inverter has an input connected to the second current carrying terminal of n-type transistor MN1, and an output connected to the input of the second inverter. The second inverter has an output connected to the input of the first inverter. When both XA and XB are low, or only one of XA and XB is low, the output of the NAND gate is high. The high output of the NAND gate is passed to the input of the cross-coupled pair of inverters when the HV Blocking signal turns on the n-type transistor MN1. The output of the cross-coupled inverters inverts the high input signal to low output signal negative voltage/GND. When both XA and XB are high and the output of the NAND gate is low, or the HV Blocking signal turns off the n-type transistor MN1, then the output of the cross-coupled inverters inverts the low input signal to high output signal HV/VDD.

Figure 2:
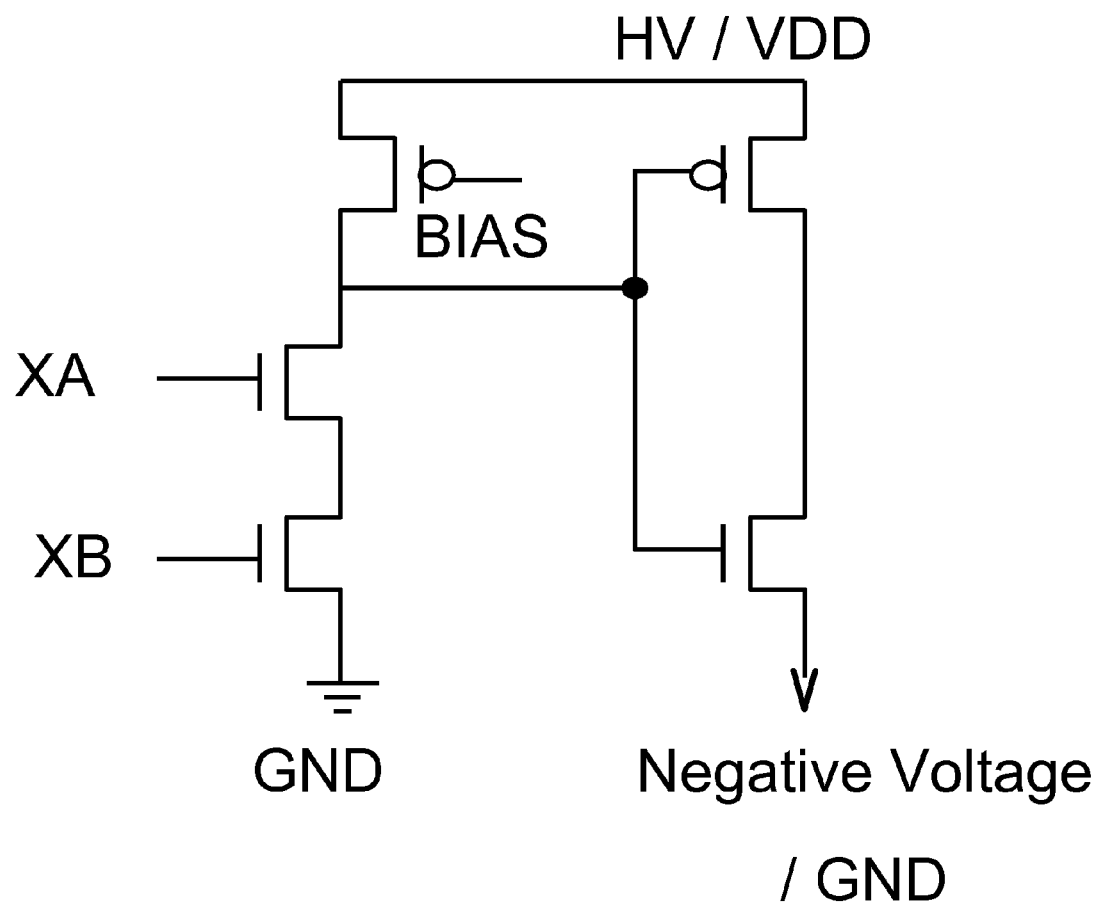
FIG. 2 is another example of an X-decoder circuit that decodes a memory address to a word line of a memory array.

FIG. 2 is another example of an X-decoder circuit that decodes a memory address to a word line of a memory array.

This X-decoder circuit has poor decoding functions, in that it requires applying a negative voltage to all word lines in the sector of memory cells, rather a selected word line in the sector of memory cells.

In FIG. 2, two subcircuits are connected between voltages "HV/VDD" and "Negative Voltage/GND". The first subcircuit is a NAND series of transistors including a first p-type transistor with a gate receiving BIAS, a first n-type transistor receiving XA, and a second n-type transistor receiving XB. The second subcircuit is an inverter with an input connected to the node of the first subcircuit between the first p-type transistor and the first n-type transistor. When XA and XB are both high, the input of the inverter is connected to GND and the inverter output is HV/VDD. When XA and XB are both low or only one of XA and XB is low, the input of the inverter is disconnected from GND, the input of the inverter is connected to HV/VDD via the first p-type transistor with a gate receiving BIAS, and the inverter output is negative voltage/GND.

Figure 3:
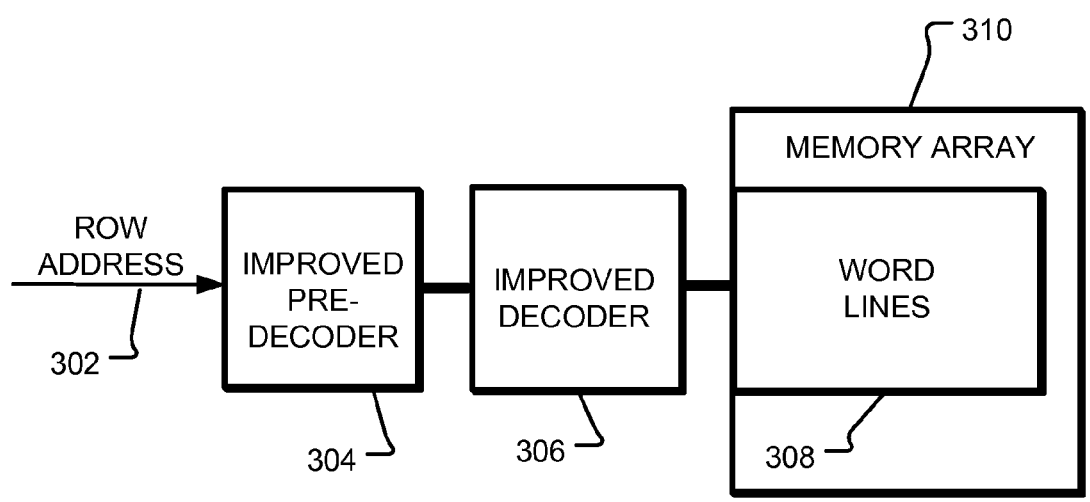
FIG. 3 is a simplified block diagram of that shows the interconnection of circuitry from row address signal lines to the word lines of a memory array.

FIG. 3 is a simplified block diagram of that shows the interconnection of circuitry from row address signal lines to the word lines of a memory array.

The row address signal is carried by row address signal lines 302 to the improved pre-decoder 304. The pre-decoder sends the partially decoded word line address signals to the improved decoder 306. Finally, the improved decoder 306 selects or deselects particular word lines 308 in the nonvolatile memory array 310.

Figure 4:
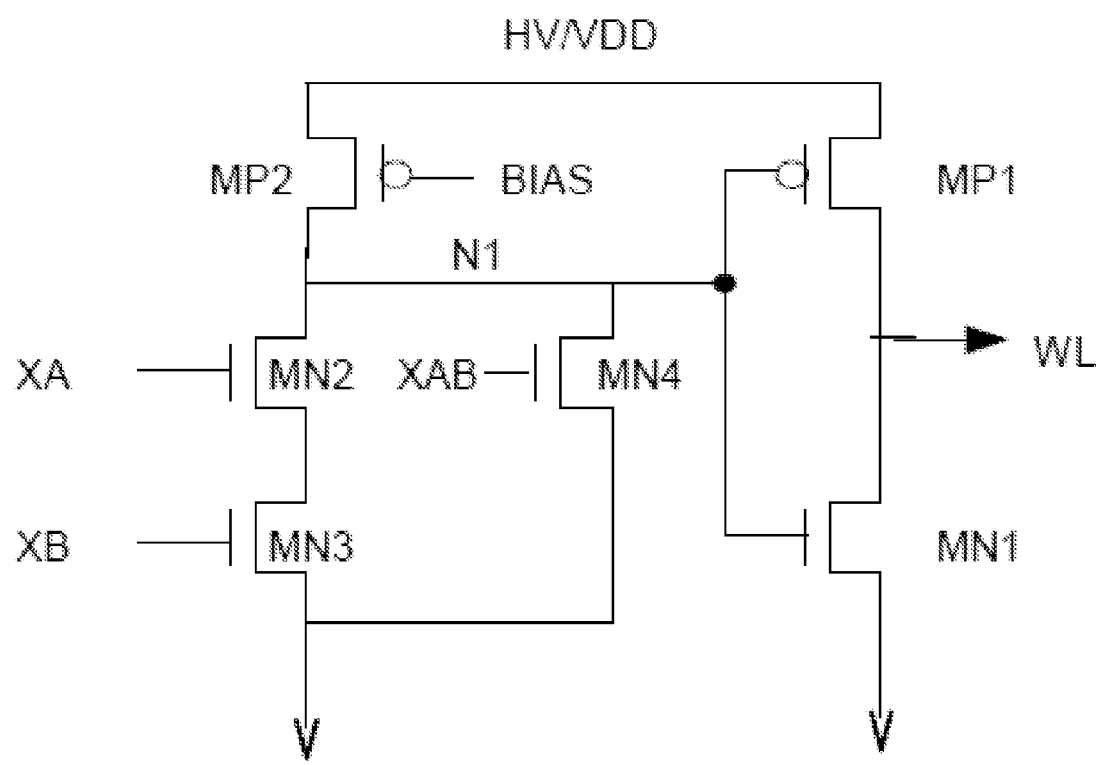
FIG. 4 is an example of an improved X-decoder circuit that decodes a memory address to a memory word line.

FIG. 4 is an example of an improved X-decoder circuit that decodes a memory address to a memory word line.

Compared to the X-decoder circuit design of FIG. 2, an extra transistor is added. The extra transistor can have a relatively small size.

In FIG. 4, two subcircuits are connected between voltages "HV/VDD" and the lower voltage reference. The first subcircuit is an inverter including p-type transistor MP1 and n-type transistor MN1, with an input connected to node N1 and an output connected to WL. The second subcircuit has: (i) a p-type transistor MP2 with a gate receiving BIAS and current carrying terminals connected to HV/VDD and node N1; (ii) a NAND series pair of transistors connected between node N1 and the lower voltage reference, including an n-type transistor MN2 receiving XA and an n-type transistor MN3 receiving XB; and (iii) an n-type transistor MN4 receiving XAB connected between node N1 and the lower voltage reference.

In normal decoding, the transistors receiving the signals XA and XB act as a NAND gate (XA NAND XB). In erase mode, the transistors receiving the signals XB and XAB (XAbar) act as a NOR gate (XB NOR XAB).

The transistors receiving the signals XA, XB, and XAB (XAbar) must switch between the positive supply voltage, vdd, and a negative voltage (such as for erase). The suffix "B" or "bar" indicates an inversion of the signal.

The transistor receiving the signal XAB is active only in erase mode.

The signal XB is negative for the decoder of a selected word line in erase mode, and the signal XB is positive for the decoder of a selected word line in read and program modes. The pre-decoder implements this polarity difference.

Because of the arrangement of transistors receiving the signals XA, XB, and XAB, the X-decoder circuit of FIG. 4 can select a single WL of a sector to receive a negative voltage, or several WLs of a sector to receive a negative voltage, in varying embodiments. The table below shows the values of the signals XA, XB, and XAB; for erase, program, and read operations.

|  |  | XA | XB | XAB |
|---|---|---|---|---|
| Read | select WL | Vdd | Vdd | GND |
|  | Deselect WL | GND | GND | GND |
| Program | select WL | VDD | VDD | GND |
|  | Deselect WL | GND | GND | GND |
| Erase | select WL | VDD | Negative (GND) | Negative (GND) |
|  | Deselect WL | Negative (GND) | VDD | VDD |

The transistor receiving the "BIAS" signal controls the current flow through transistor MP2. This current can pull up node N1, and then the voltage of WL goes low.

When the WL is selected, transistors MN2 and MN3 turn on, pulling down node N1; then the voltage of WL goes high.

Transistor MP2 is always turned on (weakly), and causes a "fighting current" in transistors MP2, MN2, and MN3. When transistors MN2 and MN3 are turned on, because transistors MN2 and MN3 are larger and stronger, the node N1 is pulled down despite transistor MP2 always being turned on.

In read mode, the "fighting current" is larger, because of read speed limitations of a maximum read time. However, in erase mode, "fighting current" is smaller. Because erase is not a high speed operation, transistor MN4 receiving the XAB signal can be very small.

Figure 5:
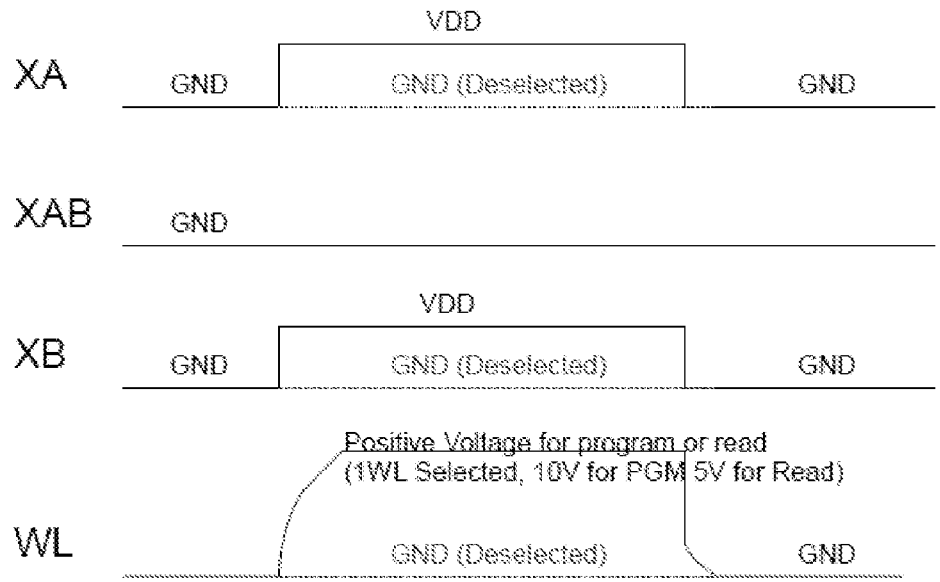
FIG. 5 is an example of voltage versus time traces for the input/output signals of the improved X-decoder circuit of FIG. 4, for both a read operation and a program operation, and for both an X-decoder circuit of a selected word line and an X-decoder circuit of a deselected word line.

FIG. 5 is an example of voltage versus time traces for the input/output signals of the improved X-decoder circuit of FIG. 4, for both a read operation and a program operation, and for both an X-decoder circuit of a selected word line and an X-decoder circuit of a deselected word line.

Figure 6:
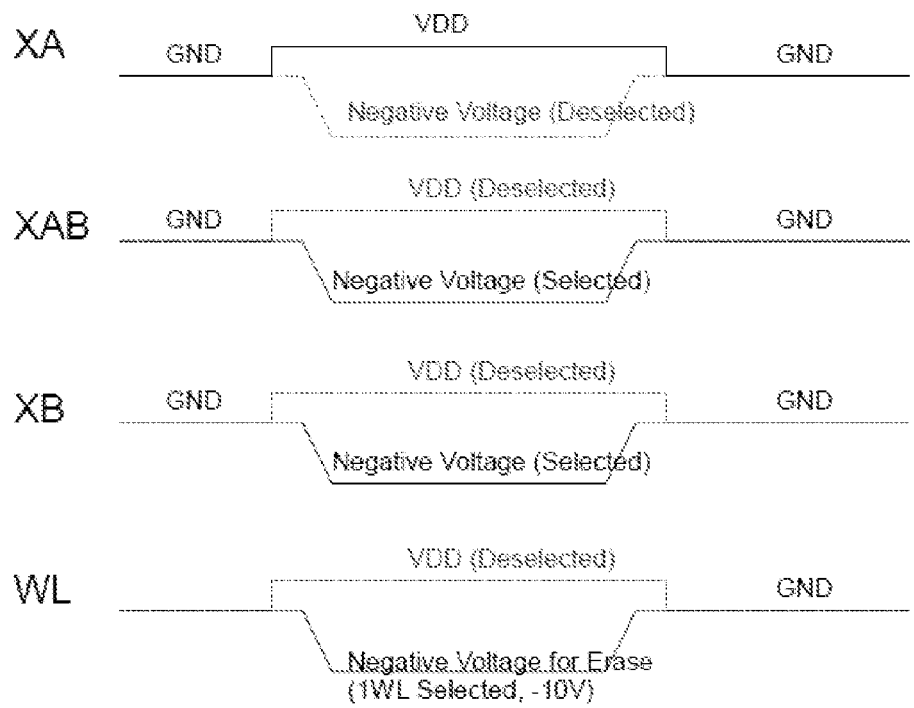
FIG. 6 is an example of voltage versus time traces for the input/output signals of the improved X-decoder circuit of FIG. 4, for an erase operation, and for both an X-decoder circuit of a selected word line and an X-decoder circuit of a deselected word line.

FIG. 6 is an example of voltage versus time traces for the input/output signals of the improved X-decoder circuit of FIG. 4, for an erase operation, and for both an X-decoder circuit of a selected word line and an X-decoder circuit of a deselected word line.

Figures 7, 8:
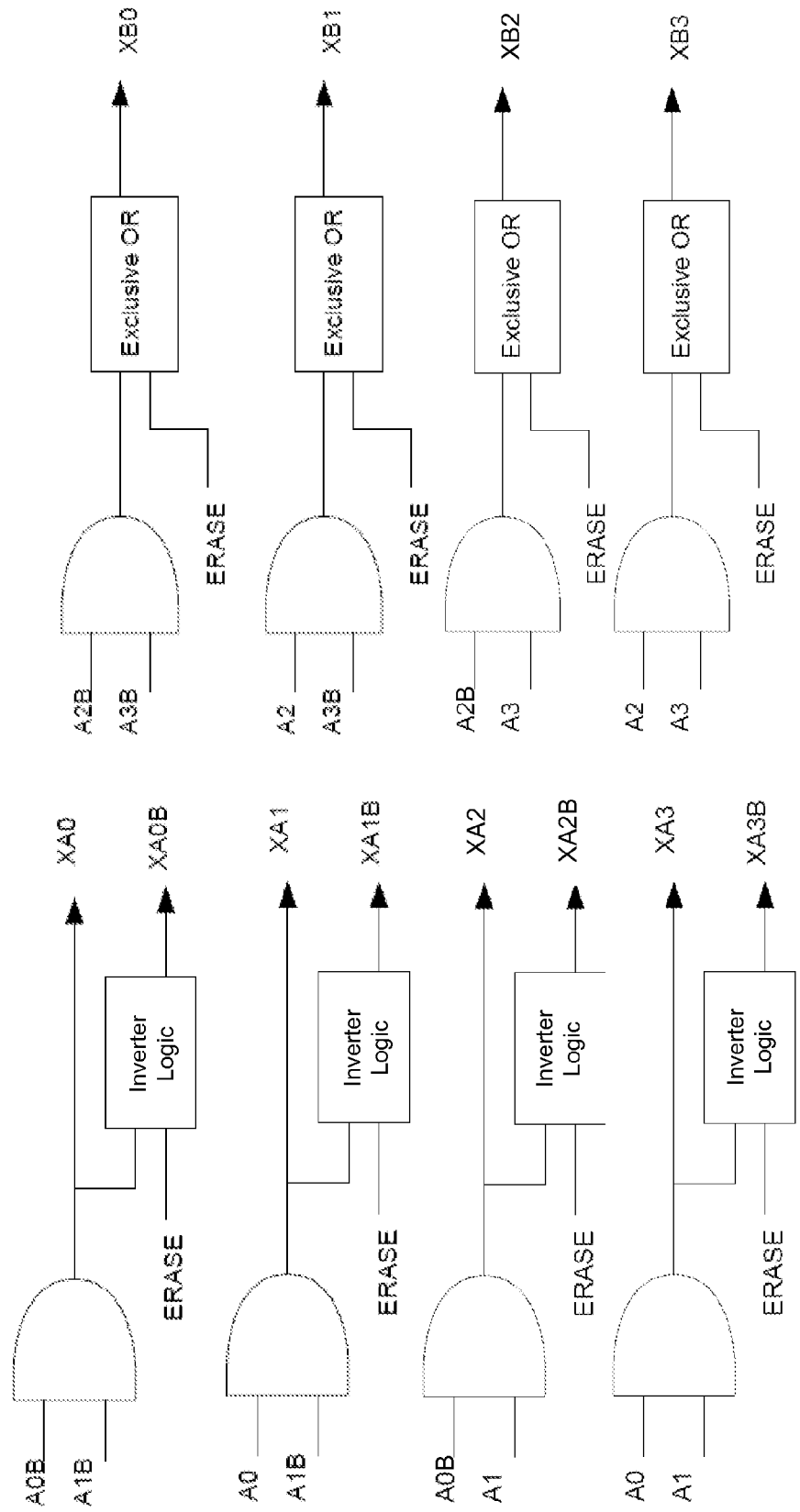
FIG. 7 is an example of pre-decoder circuits that generate input signals of the improved X-decoder circuit of FIG. 4, for an erase operation.
FIG. 8 is an example of additional pre-decoder circuits that generate input signals of the improved X-decoder circuit of FIG. 4, for an erase operation.

FIG. 7 is an example of pre-decoder circuits that generate input signals of the improved X-decoder circuit of FIG. 4, for an erase operation.

In FIG. 7, there are 4 sets of circuits including AND gates generating XA#, and inverter logic which inverts the XA# to XA#B. The # character indicates a natural number 0, 1, 2, 3, etc. The first set of circuits has an AND gate with inputs receiving A0B and A1B, and an output generating XA0 and connected to inverter logic. The inverter logic of the first set of circuits has an output generating XA0B which is an inverted version of XA0. The second set of circuits has an AND gate with inputs receiving A0 and A1B, and an output generating XA1 and connected to inverter logic.

The inverter logic of the second set of circuits has an output generating XA1B which is an inverted version of XA1. The third set of circuits has an AND gate with inputs receiving A0B and A1, and an output generating XA2 and connected to inverter logic. The inverter logic of the third set of circuits has an output generating XA2B which is an inverted version of XA2. The fourth set of circuits has an AND gate with inputs receiving A0 and A1, and an output generating XA3 and connected to inverter logic. The inverter logic of the fourth set of circuits has an output generating XA3B which is an inverted version of XA3. The inverter logic receives ERASE in the 4 sets of circuits.

FIG. 8 is an example of additional pre-decoder circuits that generate input signals of the improved X-decoder circuit of FIG. 4, for an erase operation.

In FIG. 8, there are 4 sets of circuits. The first set of circuits has an AND gate with inputs receiving A2B and A3B and an output connected to an XOR gate. The XOR gate has an output generating XB0. The second set of circuits has an AND gate with inputs receiving A2 and A3B and an output connected to an XOR gate. The XOR gate has an generating output XB1. The third set of circuits has an AND gate with inputs receiving A2B and A3 and an output connected to an XOR gate. The XOR gate has an output generating XB2. The fourth set of circuits has an AND gate with inputs receiving A2 and A3 and an output connected to an XOR gate. The XOR has an output generating XB3. The XOR gate also receives ERASE in the 4 sets of circuits.

In FIGS. 7 and 8, signals A0~A3 are the input address, and A0B~A3B are inverted versions of signals A0~A3.

Figure 9:
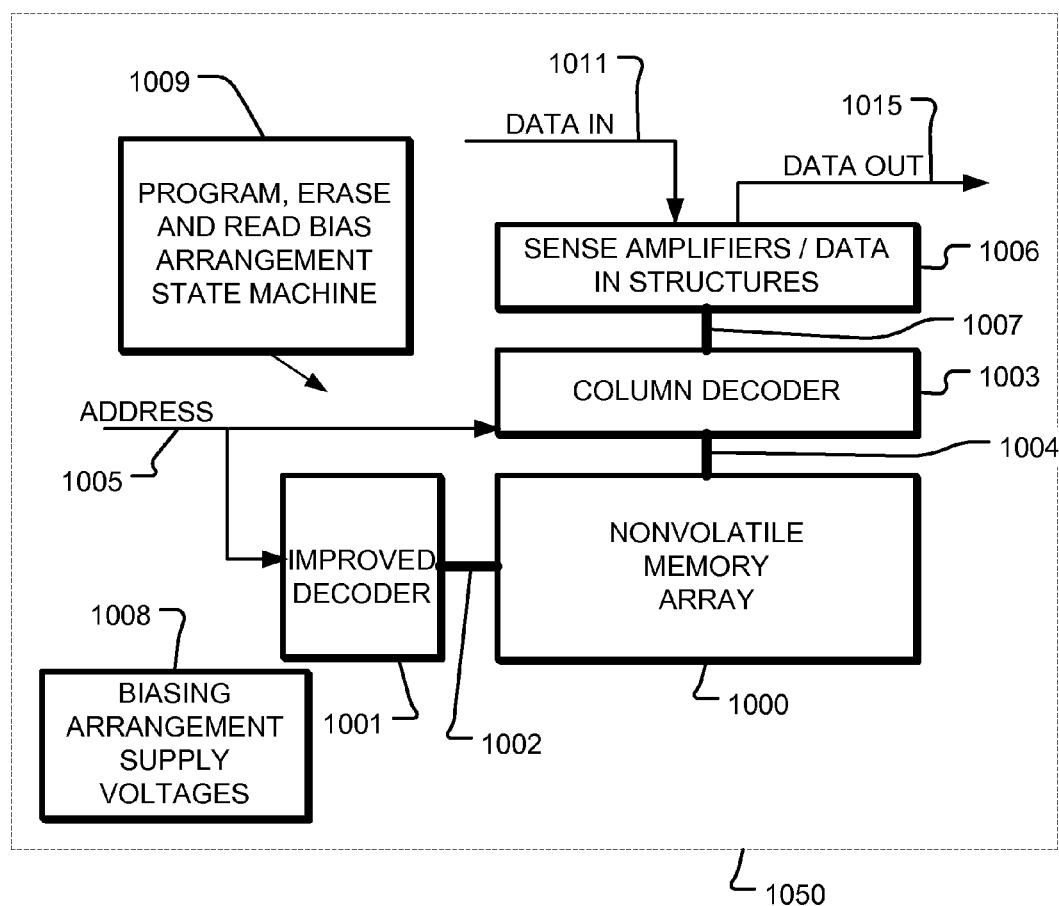
FIG. 9 is a block diagram of an example memory integrated circuit with the improved decoder circuit.

FIG. 9 is a block diagram of an example memory integrated circuit with the improved decoder circuit.

A word line decoder 1001 is coupled to, and in electrical communication with, a plurality of word lines 1002, arranged along rows in the memory array 1000. A bit line (column) decoder and drivers 1003 are coupled to and in electrical communication with a plurality of bit lines 1004 arranged along columns in the memory array 1000 for reading data from, and writing data to, the memory cells in the memory array 1000. Addresses are supplied on bus 1005 to the word line decoder 1001 and to the bit line decoder 1003. Sense amplifiers and data-in structures in block 1006, including current sources for the read, program and erase modes, are coupled to the bit line decoder 1003 via the bus 1007. Data is supplied via the data-in line 1011 from input/output ports on the integrated circuit 1050, to the data-in structures in block 1006. Data is supplied via the data-out line 1015 from the sense amplifiers in block 1006 to input/output ports on the integrated circuit 1050, or to other data destinations internal or external to the integrated circuit 1050. State machine and improved clock circuitry are in circuitry 1009, controlling biasing arrangement supply voltages 1008.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. An apparatus, comprising:
a memory integrated circuit including:
   a plurality of decoder circuits controlling a plurality of word lines, the plurality of decoder circuits processing word line addresses to identify, with a specificity of individual word lines, a subset of the plurality of word lines to perform an erase operation on the subset of the plurality of word lines, a decoder circuit of the plurality of decoder circuits including:
      an inverter having an input and an output controlling a word line to perform the erase operation, wherein a voltage range of the input extends between a first voltage reference and a second voltage reference;
      logic controlled by a word line address to determine a value of the input of the inverter during the erase operation wherein the logic includes:
         a plurality of electrical paths between an inverter determinative node and the first voltage reference, the plurality of electrical paths controlled by the word line address during the erase operation, the inverter determinative node determining the value of the input of the inverter, including:
            a first electrical path of the plurality of electrical paths turned on during the erase operation for the decoder circuits controlling word lines unselected for the erase operation; and
            a second electrical path of the plurality of electrical paths turned on during a program operation for the decoder circuits controlling word lines selected for the program operation and during a read operation for the decoder circuits controlling word lines selected for the read operation.

2. The apparatus of claim 1, wherein the logic includes:
the plurality of electrical paths between the inverter determinative node and the first voltage reference, the plurality of electrical paths controlled by the word line address during the erase operation, the inverter determinative node determining the value of the input of the inverter during the erase operation.

3. The apparatus of claim 1, wherein the logic includes:
the plurality of electrical paths between the inverter determinative node and the first voltage reference, the plurality of electrical paths controlled by the word line address during the erase operation, the inverter determinative node determining the value of the input of the inverter during the erase operation, the plurality of electrical paths turned off during the erase operation for the decoder circuits controlling word lines selected for the erase operation.

4. The apparatus of claim 1, wherein the logic includes:
the plurality of electrical paths between the inverter determinative node and the first voltage reference, the plurality of electrical paths controlled by the word line address during the erase operation, the inverter determinative node determining the value of the input of the inverter during the erase operation, at least one of the plurality of electrical paths turned on during the erase operation for the decoder circuits controlling word lines unselected for the erase operation.

5. The apparatus of claim 1, wherein the logic includes:
the plurality of electrical paths between the inverter determinative node and the first voltage reference, the plurality of electrical paths controlled by the word line address during the erase operation, the inverter determinative node determining the value of the output of the inverter during the erase operation; and
an electrical path between the inverter determinative node and the second voltage reference, the electrical path being turned on during the erase operation regardless of the word line address with a current capacity weaker than the plurality of electrical paths.

6. The apparatus of claim 1, the memory integrated circuit further comprising:
a plurality of pre-decoder circuits controlled by the word line addresses and controlling the logic of the plurality of decoder circuits.

7. The apparatus of claim 1, the memory integrated circuit further comprising:
a plurality of pre-decoder circuits controlled by the word line address and controlling the logic of the plurality of decoder circuits, wherein the plurality of pre-decoder circuits includes additional logic controlled by subsets of the word line address varying across the plurality of pre-decoder circuits.

8. The apparatus of claim 1, wherein the voltage range of the input extends between the first voltage reference and the second voltage reference, in that the input is free of a threshold voltage drop from preceding circuitry limiting the voltage range of the input.

9. An apparatus, comprising:
a memory integrated circuit powered by a plurality of reference voltages including a first voltage reference and a second voltage reference, the memory integrated circuit including:
a plurality of decoder circuits controlling a plurality of word lines, the plurality of decoder circuits processing word line addresses to identify, with a specificity of individual word lines, a subset of the plurality of word lines to perform an erase operation on the subset of the plurality of word lines, a decoder circuit of the plurality of decoder circuits including:
an inverter having an input and an output controlling a word line to perform the erase operation, wherein a voltage range of the input extends between the first voltage reference and the second voltage reference; and
logic including:
a plurality of electrical paths between an inverter determinative node and the first voltage reference, the plurality of electrical paths controlled by the word line address during the erase operation, the inverter determinative node determining the value of the output of the inverter; and
an electrical path between the inverter determinative node and the second voltage reference, the electrical path being turned on during the erase operation, program operation, and read operation regardless of the word line address with a current capacity weaker than the plurality of electrical paths; and
an array of memory cells controlled by the plurality of word lines, such that a word line address identifies an individual word line of the plurality of word lines that applies voltages.

10. A method, comprising:
processing, on a memory integrated circuit with a plurality of word lines, word line addresses, including:
identifying, with a specificity of individual word lines, a subset of the plurality of word lines to perform an erase operation on the subset of the plurality of word lines; and
determining values of inputs of inverters having outputs controlling word lines from the plurality of word lines to perform the erase operation, the inputs of the inverters having a voltage range that extends between a first voltage reference and a second voltage reference; and
responsive to the processing, the outputs of the inverters controlling the word lines to perform the erase operation,
wherein the processing includes:
responsive to a word line address of the word line addresses, controlling, for an inverter of the inverters, a plurality of electrical paths between an inverter determinative node of the inverter and the first voltage reference, the inverter determinative node determining the value of an input of the inverter, including:
turning on a first electrical path of the plurality of electrical paths during the erase operation for the inverter controlling a word line unselected for the erase operation; and
turning on a second electrical path of the plurality of electrical paths during a program operation for the inverter controlling a word line selected for the program operation and during a read operation for the inverter controlling a word line selected for the read operation.

11. The method of claim 10, wherein the processing includes:
responsive to the word line address of the word line addresses, controlling, for the inverter of the inverters, the plurality of electrical paths between the inverter determinative node of the inverter and the first voltage reference, the inverter determinative node determining the value of an input of the inverter during the erase operation.

12. The method of claim 10, wherein the processing includes:
responsive to the word line address of the word line addresses, controlling, for the inverter of the inverters, the plurality of electrical paths between the inverter determinative node of the inverter and the first voltage reference, the inverter determinative node determining the value of an input of the inverter during the erase operation, including:
turning off the plurality of electrical paths during the erase operation for the inverter controlling the word line selected for the erase operation.

13. The method of claim 10, wherein the processing includes:
responsive to the word line address of the word line addresses, controlling, for the inverter of the inverters, the plurality of electrical paths between the inverter determinative node of the inverter and the first voltage reference, the inverter determinative node determining the value of an input of the inverter during the erase operation, including:
turning on at least one of the plurality of electrical paths during the erase operation for the inverter controlling a word line unselected for the erase operation.

14. The method of claim 10, wherein the processing includes:
responsive to the word line address of the word line addresses, controlling, for the inverter of the inverters, the plurality of electrical paths between the inverter determinative node of the inverter and the first voltage reference, the inverter determinative node determining the value of an output of the inverter during the erase operation; and
turning on an electrical path, with a current capacity weaker than the plurality of electrical paths, between the inverter determinative node and the second voltage reference during the erase operation regardless of the word line address.

15. A method, comprising:
processing, on a memory integrated circuit with a plurality of word lines, word line addresses, including:
identifying, with a specificity of individual word lines, a subset of the plurality of word lines to perform an erase operation on the subset of the plurality of word lines; and
determining values of inputs of inverters having outputs controlling word lines from the plurality of word lines to perform the erase operation, the inputs of the inverters having a voltage range that extends between a first voltage reference and a second voltage reference; and
responsive to the processing, the outputs of the inverters controlling the word lines to perform the erase operation,
wherein the processing includes:
responsive to a word line address of the word line addresses, controlling, for an inverter of the inverters, a plurality of electrical paths between an inverter determinative node of the inverter and the first voltage reference, the inverter determinative node determining the value of an output of the inverter during the erase operation; and
turning on an electrical path, with a current capacity weaker than the plurality of electrical paths, between the inverter determinative node and the second voltage reference during the erase operation, a program operation, and a read operation, regardless of the word line address.

16. The method of claim 10, wherein the processing includes:
processing the word line addresses in a plurality of pre-decoder circuits.

17. The method of claim 10, wherein the voltage range of the inputs extends between the first voltage reference and the second voltage reference, in that the inputs are free of a threshold voltage drop from preceding circuitry limiting the voltage range of the inputs.

18. An apparatus, comprising:
a memory integrated circuit including:
a plurality of decoder circuits controlling a plurality of word lines, the plurality of decoder circuits processing word line addresses to identify, with a specificity of individual word lines, a subset of the plurality of word lines to perform an erase operation on the subset of the plurality of word lines, a decoder circuit of the plurality of decoder circuits including:
an inverter having an input and an output controlling a word line to perform the erase operation, wherein a voltage range of the input extends between a first voltage reference and a second voltage reference;
logic controlled by a word line address to determine a value of the input of the inverter during the erase operation, the logic including a pull-up electrical path between an inverter determinative node determining the value of the input of the inverter and the second voltage reference, the pull-up electrical path being turned on during at least a read operation, and the pull-up electrical path being turned on during at least a programming operation on the word line, and
the logic including another electrical path between the inverter determinative node and the second voltage reference, said another electrical path being turned on during the erase operation regardless of the word line address with a current capacity weaker than the plurality of electrical paths.

* * * * *